(12) United States Patent
Kao

(10) Patent No.: US 6,899,788 B2
(45) Date of Patent: May 31, 2005

(54) ARTICLE HOLDERS THAT USE GAS VORTICES TO HOLD AN ARTICLE IN A DESIRED POSITION

(75) Inventor: Sam Kao, San Mateo, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 220 days.

(21) Appl. No.: 10/388,968

(22) Filed: Mar. 13, 2003

(65) Prior Publication Data

US 2003/0178146 A1 Sep. 25, 2003

Related U.S. Application Data

(62) Division of application No. 09/877,366, filed on Jun. 8, 2001.

(51) Int. Cl.$^7$ ............................ H01L 21/00; C23C 16/00
(52) U.S. Cl. .............................. 156/345.53; 156/345.51; 156/345.54; 156/345.55; 118/724; 118/728; 118/729; 118/730; 118/731; 204/298.01; 269/20; 62/404

(58) Field of Search ..................... 156/345.53, 345.51, 156/345.54, 345.55; 118/724, 728, 729, 730, 731; 204/298.01; 269/20; 62/404

(56) References Cited

U.S. PATENT DOCUMENTS 6,168,697 B1    1/2001  Siniaguine et al.

FOREIGN PATENT DOCUMENTS

WO    97/45862    12/1997
WO    00/70659    11/2000

*Primary Examiner*—Gregory Mills
*Assistant Examiner*—Ram N Kackar
(74) *Attorney, Agent, or Firm*—Michael Shenker; MacPherson Kwok Chen & Heid LLP

(57) ABSTRACT

An article (e.g. a semiconductor wafer) is held in an article holder by means of a number of gas flows emitted from gas vortex chambers. Some of the gas flows act to cool an adjacent article portion more than the other gas flows. For example, some of the vortex chambers emit more gas per unit of time than the other chambers. More cooling is provided to those portions of the article which are heated more during processing. Greater temperature uniformity can be achieved.

3 Claims, 4 Drawing Sheets

202.1

ARTICLE HOLDERS THAT USE GAS VORTICES TO HOLD AN ARTICLE IN A DESIRED POSITION

CROSS REFERENCE TO RELATED APPLICATIONS

The present application is a division of application Ser. No. 09/877,366 filed Jun. 8, 2001, incorporated herein by reference.

BACKGROUND

The present invention relates to article holders that use gas vortices to hold an article in a desired position.

U.S. Pat. No. 6,168,697 issued Jan. 2, 2001 to Siniaguine et al., describes a wafer holder which emits gas vortices to hold a semiconductor wafer in a desired position while the wafer is etched with a plasma etch. The vortices have low pressure zones that hold the wafer proximate to the holder. In addition, the vortices cool the wafer. Unfortunately, the wafer cooling is not uniform. Portions of the wafer near the vortex outlets are cooled more than the rest of the wafer. The non-uniform cooling may have a negative effect on the etch uniformity, the etch rate being higher where the wafer is hotter.

SUMMARY

Some embodiments of the present invention exploit the non-uniform cooling by the vortices to compensate for other conditions that create temperature non-uniformity. Such conditions may include wafer motion, e.g. rotation. Those portions of the wafer that are farther from the rotation axis move faster, and hence are cooled more by ambient gas, than the wafer portions close to the rotation axis. In some embodiments of the invention, the vortices are arranged to provide more cooling closer to the rotation axis. For example, in some embodiments, a vortex chamber close to the rotation axis emits more gas per unit of time than a vortex chamber farther from the rotation axis.

The invention is not limited by the embodiments described above. The invention is not limited to plasma etches or semiconductor wafers. Other features and advantages of the invention are described below.

DESCRIPTION OF PREFERRED EMBODIMENTS

Figure 1:
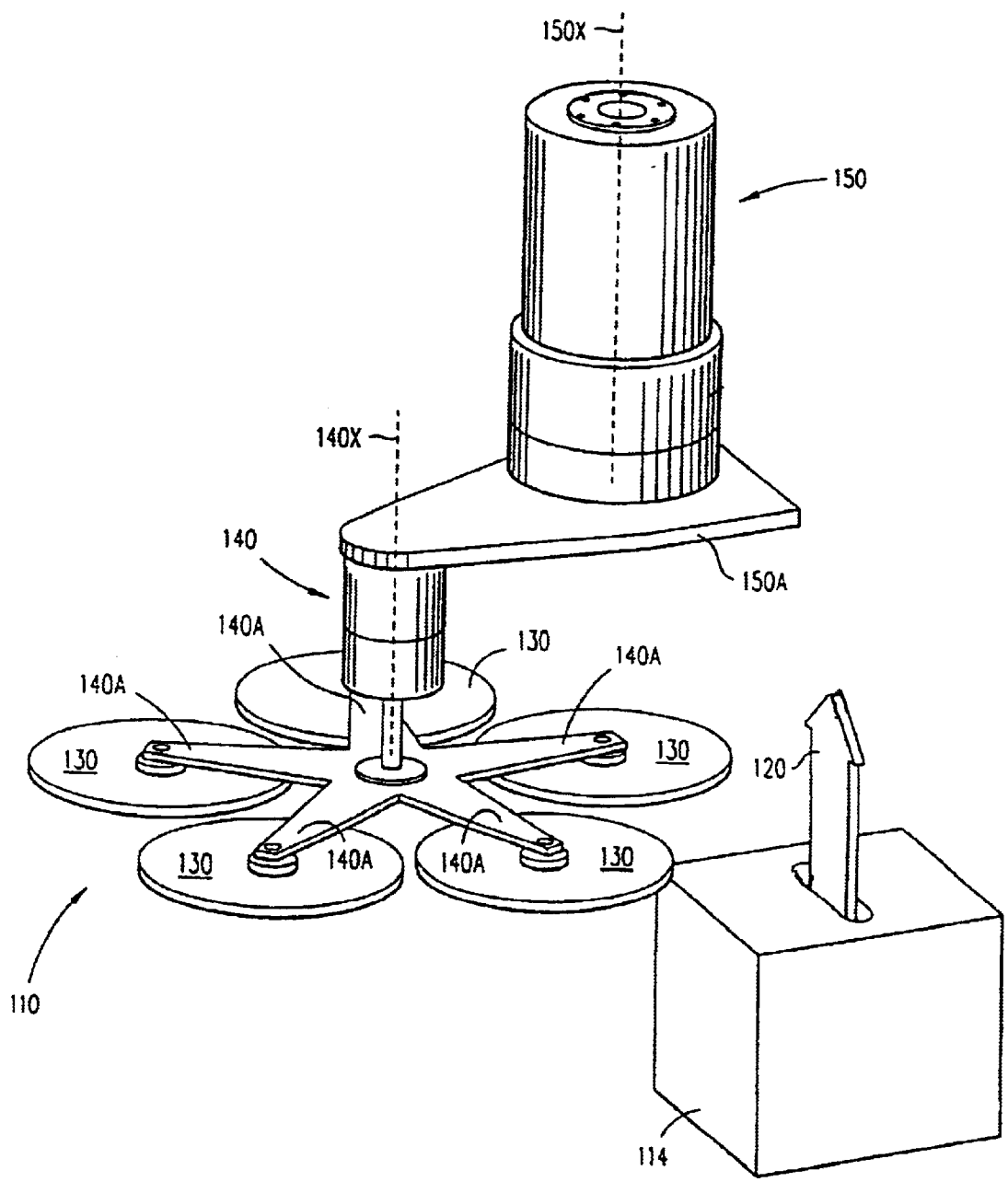
FIG. 1 is a perspective view of a plasma processing system incorporating one embodiment of the present invention.

FIG. 1 illustrates a plasma processing system 110 incorporating one embodiment of the present invention. Plasma source 114 generates a plasma jet 120 flowing upward towards semiconductor wafers (not shown). The wafers are positioned under wafer holders 130. Holders 130 are attached to arms 140A of an angle drive 140. Drive 140 rotates the wafers around a vertical axis 140X. Drive 140 is attached to an arm 150A of an angle drive 150. Drive 150 rotates the wafers around a vertical axis 150X. When a wafer passes through the plasma, the wafer is heated. When a wafer is out of the plasma, the wafer is cooled by ambient atmosphere (e.g. air or some other ambient gas). The ambient pressure is atmospheric pressure. With the exception of the wafer holders, the system 110 can be identical to a system described in PCT publication WO 00/70659 (TruSi Technologies, LLC, 23 Nov. 2000) incorporated herein by reference, although the present invention is not limited to such embodiments. In some embodiments, drive 150 is absent, axis 140X is stationary. In other embodiments, more than two rotational motions are provided. See for example U.S. patent application Ser. No. 09/713,137, "Plasma Processing Comprising Three Rotational Motions of an Article Being Processed", filed by O. Siniaguine et al. on Nov. 14, 2000, incorporated herein by reference. Any number of holders 130 may be present. Plasma source 114 may or may not move during processing.

Figure 2:
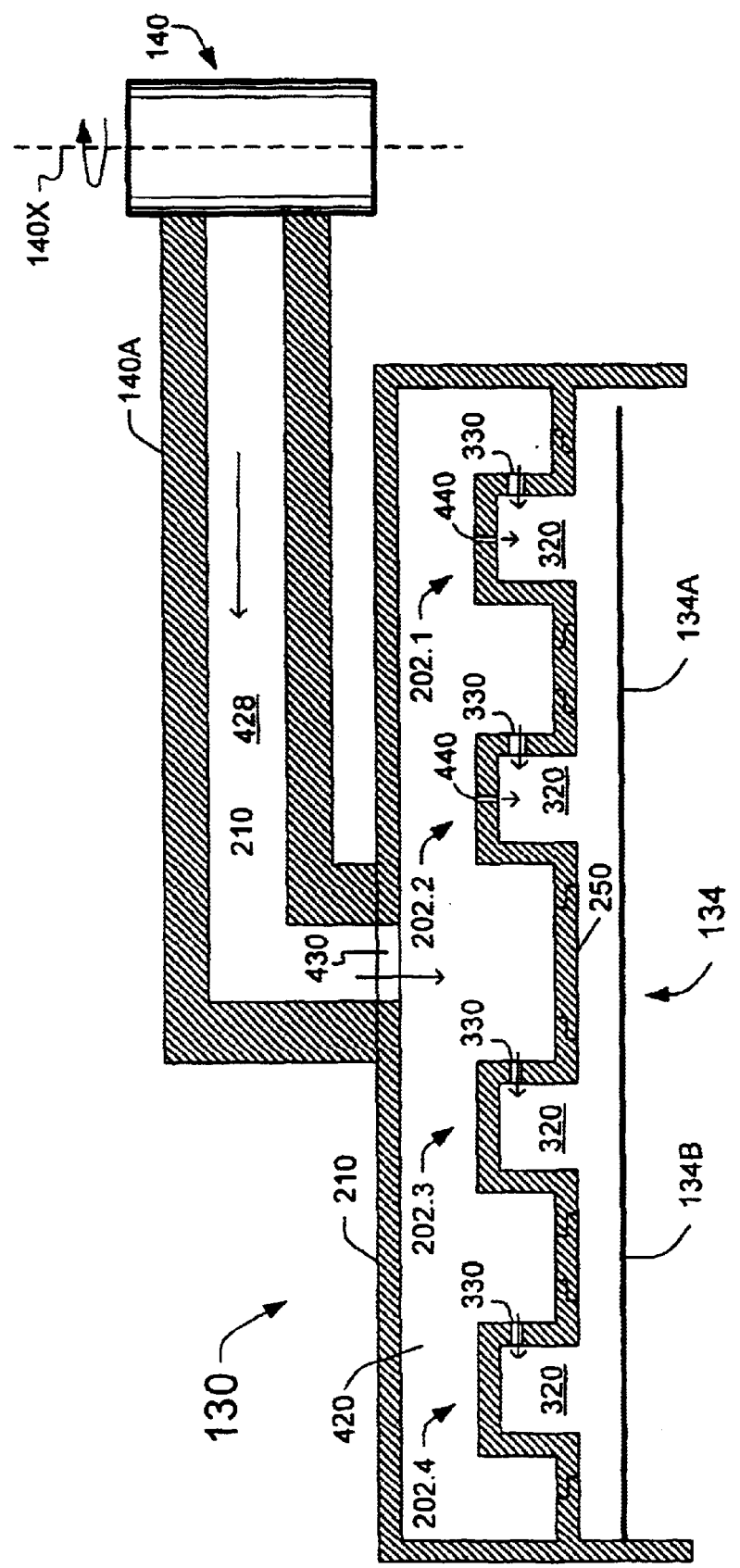
FIG. 2 is a cross section illustration of a portion of one embodiment of the system of FIG. 1.

The wafer points farther from axis 140X can have higher linear velocities, and be cooled more by the ambient gas, than the wafer points close to axis 140X. The cooling non-uniformity can be especially noticeable if the wafer processing occurs at atmospheric pressure or higher pressure, but can also be noticeable at lower pressures. This non-uniformity is at least partially compensated by gas flows emitted by the wafer holders. FIG. 2 is a cross-sectional view showing a single holder 130 holding a wafer 134. Vortex chucks 202.1 through 202.4 are mounted in holder body 210 above the holder's bottom surface 250. Although four chucks are shown, any number of chucks greater than one can be present. Chucks 202.1, 202.2 are closer to axis 140X than chucks 202.3, 202.4. Chucks 202.1, 202.2 are constructed to have a greater cooling effect on the wafer than chucks 202.3, 202.4.

Figure 3:
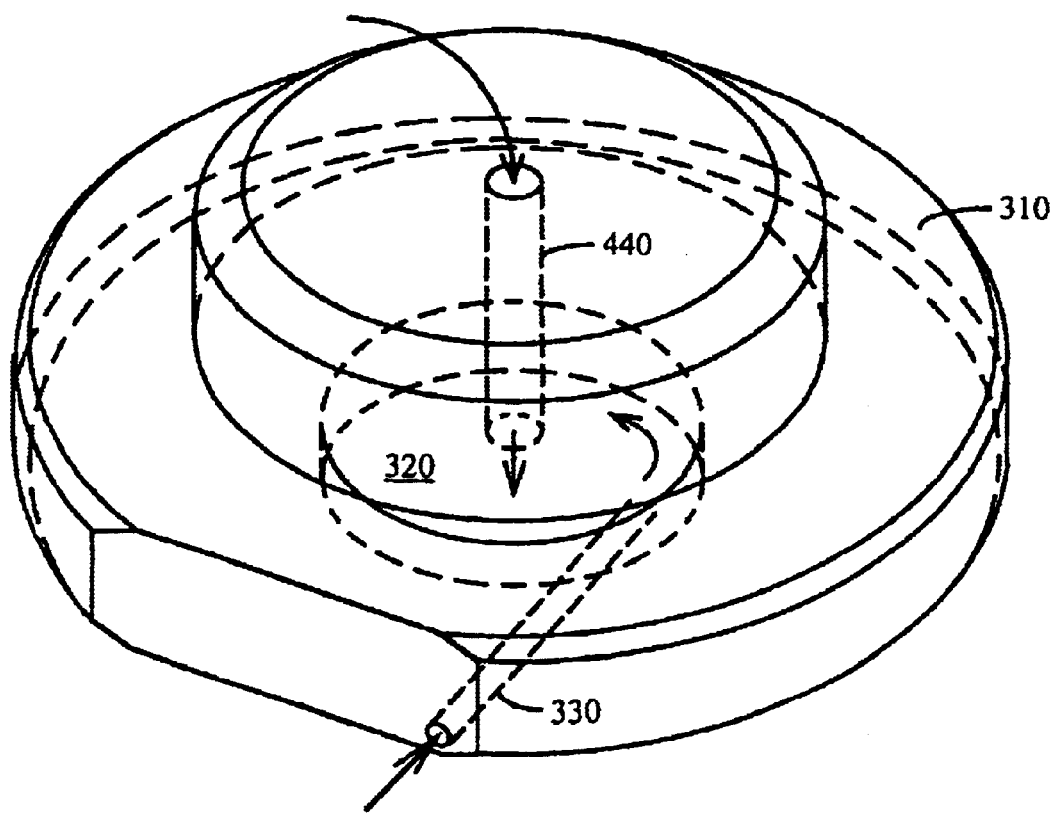
FIG. 3 is a perspective view of a vortex chuck according to one embodiment of the present invention.

FIG. 3 is a semi-transparent, perspective view of a chuck 202.1. Chuck 202.2 is identical, and chucks 202.3, 202.4 are similar except as described below. Chuck 202.1 is described in U.S. patent application Ser. No. 09/633,086, entitled "Non-Contact Workpiece Holder Using Vortex Chuck with Central Gas Flow", filed Aug. 4, 2000 by S. Kao and incorporated herein by reference. Other kinds of chucks can also be used. Chuck 202.1 of FIG. 3 includes a body 310 surrounding a vortex chamber cavity 320. The cavity is shown as being cylindrical, but a hemispherical cavity or a cavity having another shape might also be employed.

A tangential inlet passage 330 conducts a gas flow into vortex chamber 320. This gas flow has a tangential component substantially parallel to a horizontal surface of wafer 134. This component creates a vortex in chamber 320. Multiple tangential passages are provided in some embodiments.

Chucks 202.3, 202.4 have the same construction, but their passages 330 are more narrow. In some embodiments, each passage 330 is a cylindrical bore having a diameter of 0.016 inches for chucks 202.1, 202.2, but only 0.010 inches for chucks 202.3, 202.4. These dimensions are illustrative and not limiting.

As shown in FIG. 2, holder body 210 has a cavity 420 that is pressurized via a gas passage 428 in arm 140A and a gas inlet passage 430 in body 210. Gas (e.g. air or nitrogen) in cavity 420 is under positive pressure. The gas in cavity 420 is optionally a temperature-controlled gas, typically cooler than the wafer when the wafer has been heated by the plasma. The pressurized gas in cavity 420 flows out of this cavity and into chambers 320 via passages 330. The gas flow from each tangential passage 330 creates a vortex having a low pressure region near the center of the corresponding chamber 320. Consequently, the wafer 134 is drawn to the surface 250 of holder 130. At the same time, gas escaping through outlets of chambers 320 creates a gas cushion between the wafer and the holder that prevents the wafer from contacting the holder's surface 250.

The gas flow from each of chucks 202.1, 202.2 is larger than the gas flow from each of chucks 202.3, 202.4 due to the different dimensions of the passages 330. In some embodiments, the four chucks 202 are identical except for the dimensions of the passages 330. Larger gas flows which exit the chucks 202.1, 202.2 result in the wafer portion 134A facing these chucks to be cooled more than the wafer portion 134B facing the chucks 202.3, 202.4.

The chuck of FIG. 3 includes a gas inlet passage 440 which directs a gas flow perpendicular to surface 250. In some embodiments, passage 440 is at some other angle to surface 250, and passage 440 may or may not be directed along a center axis of cavity 320. (The invention is not limited to cavities 320 having a center axis.) Multiple passages 440 can be provided. Gas flowing through each passage 440 increases the pressure at the center of the vortex and leads to a more uniform pressure profile across the chuck's outlet, as explained in the aforementioned U.S. patent application Ser. No. 09/633,086. In some embodiments, passages 440 are provided in chucks 220.1, 220.2 but not in chucks 202.3, 202.4. The gas flowing through passages 440 increases the total gas outflow from chucks 202.1, 202.2 and thus enhances the cooling of wafer portion 134A. Also, in some embodiments, if passages 440 are not provided, the wider passages 330 in chucks 202.1, 202.2 cause the pressure at the center of the vortices in chucks 202.1, 202.2 to be lower than in chucks 202.3, 202.4, resulting in the wafer portion 134A being drawn closer to the holder surface 250 than the wafer portion 134B. Passages 440 can be used to make the spacing between the wafer and the holder more uniform.

In some embodiments, none of the chucks is provided with passages 440. In other embodiments, all of the chucks are provided with passages 440. Chucks 202.1, 202.2 may or may not have wider passages 440 than chucks 202.3, 202.4. In some embodiments, chucks 202.1, 202.2, 202.3, 202.4 have identical passages 330 but chucks 202.1, 202.2 have wider passages 440 than chucks 202.3, 202.4, or chucks 202.3, 202.4 do not have passages 440. Other embodiments have other differences in the geometry of passages 330, 440 and chambers 320 between the chucks 202.1, 202.2 on the one hand and chucks 202.3, 202.4 on the other hand. For example, the chambers 320 of chucks 202.1, 202.2 may have a larger diameter than in chucks 202.3, 202.4, or the cavities 320 or passages 330, 440 of chucks 202.1, 202.2 may have smoother inner surfaces, or their passages 330 or 440 may be shorter or greater in number.

In some embodiments, chucks 202.1, 202.2 are not identical to each other, with the chuck 202.1 cooling the wafer more than chuck 202.2. For example, chuck 202.1 may have a larger combined cross-sectional area of passage 330 or 440 than chuck 202.2, and/or a passage 440 can be provided in chuck 202.1 but not in chuck 202.2. In some embodiments, chuck 202.3 cools the wafer more than chuck 202.4. In some embodiments, chuck 202.2 is identical to chucks 202.3, 202.4; additional cooling close to axis 140X is provided by chuck 202.1 but not chuck 202.2. In other embodiments, chucks 202.1, 202.2, 202.3 are identical, but chuck 202.4 cools the wafer less than each of the other three chucks. In other embodiments, no two chucks are identical to each other, with the chucks closer to axis 140X cooling the wafer more than the chucks farther from axis 140X (i.e. the gas that flows out of chucks 202 and holds the wafer near the holder).

In some embodiments, separate gas sources supply gas to different chucks 202. The gas flowing through the chucks close to axis 140X is colder, and/or is supplied under more pressure, than the gas flowing through the other chucks. All of the chucks may or may not be identical to each other.

In some embodiments, the chuck density is higher closer to axis 140X. The chucks and the pressures and temperatures of different gas flows may or may not be identical.

Figure 4:
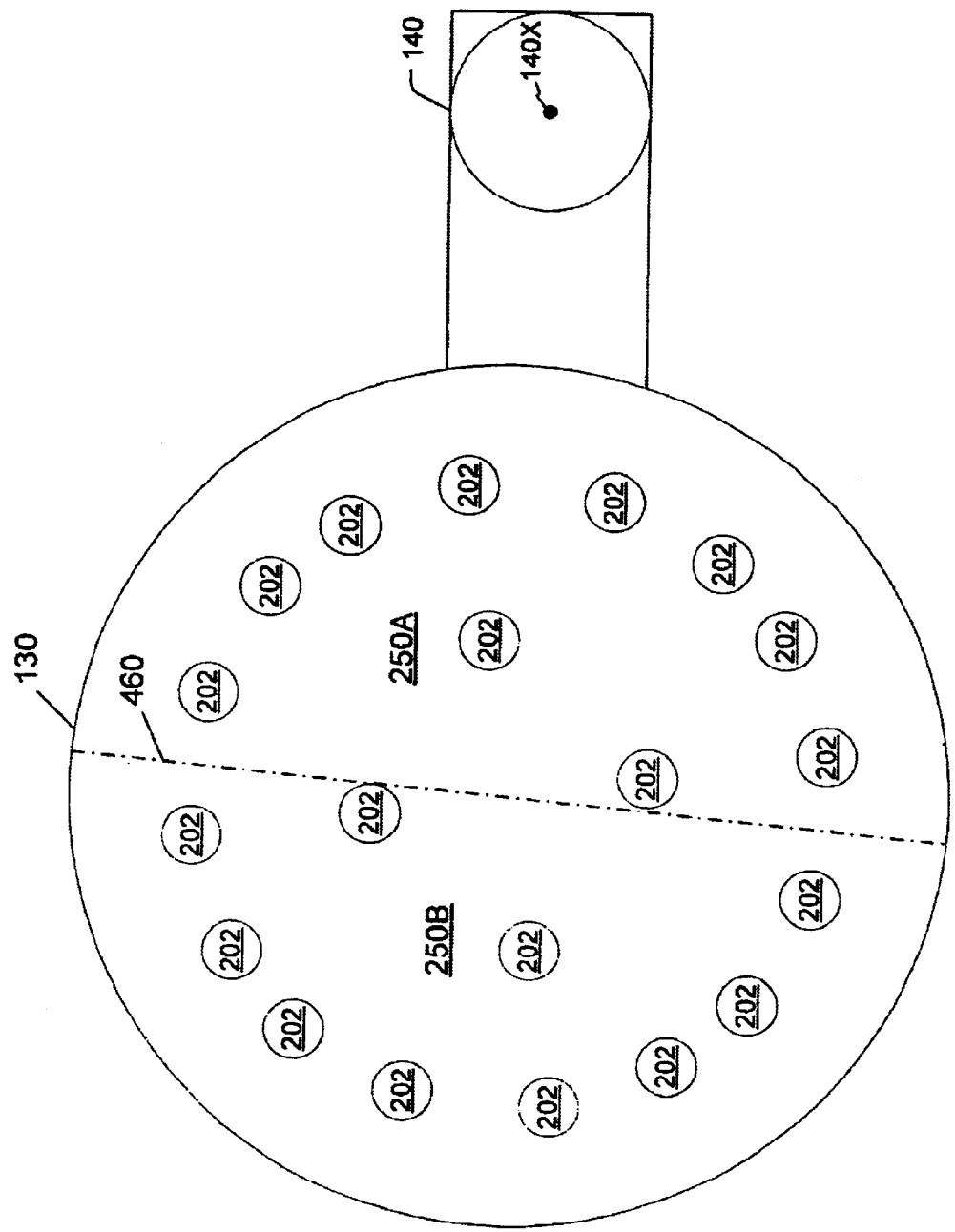
FIG. 4 is a plan view of a portion of an apparatus having a holder according to one embodiment of the present invention.

FIG. 4 is a schematic top view of one embodiment of the invention. 16 vortex chucks 202 are positioned along the periphery of wafer holder 130, and four chucks 202 are closer to the middle of the holder. This chuck positioning is shown in the aforementioned U.S. patent application Ser. No. 09/633,086. In the embodiment of FIG. 4, the eight peripheral chucks closest to the axis 140X, shown to the right of line 460, have larger passages 330 than the remaining chucks. The eight peripheral chucks to the right of line 460 are provided with passages 440, and the remaining chucks are not. The surface 250 of holder 130 has two portions 250A, 250B having equal areas. The portion 250A is closer to axis 140X than the portion 250B. In some embodiments, the portion 250A contains more vortex chuck outlets than the portion 250B, and/or the portion 250A has a larger percentage of its area occupied by the vortex chuck outlets than the portion 250B.

U.S. patent application Ser. No. 09/456,135, which is incorporated herein by reference, further describes examples of holders including multiple vortex chucks. Such holders can be modified to provide more cooling to slower moving portions of the wafer as described herein.

The above embodiments illustrate but do not limit the invention. The invention is not limited by particular dimensions, chuck positioning, or to wafers undergoing a rotational motion. The wafers can be positioned above the vortex chucks or in some other orientation. In some embodiments, the plasma footprint on the wafer is smaller than the wafer, in other embodiments the plasma footprint on the wafer is at least as large as the wafer. In FIG. 2, the distance between each chuck 202 and the axis 140X does not change during processing, but this does not have to be the case since in some embodiments, the holder motion can include a translational motion relative to axis 140X. In some embodiments, a wafer or a holder or both can rotate through an axis passing through the wafer or the holder, and more cooling can be provided closer to this axis. In FIGS. 2 and 3, chuck bodies 310 may or may not be integral with holder body 210, and each of bodies 210, 310 may or may not be of an integral construction. The invention is not limited to plasma processing or to semiconductor wafers. The invention is applicable to holders that hold panels for flat panel displays or other kinds of articles. The invention covers holders that use gas vortices in combination with other means to hold an article. For example, a holder may use gas vortices in combination with an electrostatic mechanism to hold an article. The invention is defined by the appended claims.

What is claimed is:

1. A method for holding an article, the method comprising:

emitting one or more first gas flows flowing from one or more first vortex chucks and impinging on a first portion of the article; and emitting one or more second gas flows flowing from one or more second vortex chucks an impinging on a second portion of the article;

wherein the one or more first gas flows cool the first portion of the article by more degrees than the one or more second gas flows cool the second portion of the article, wherein the method further comprising rotating the article around at least one axis, wherein a minimum distance between said axis and the one or more first vortex chucks is smaller than a minimum distance between said axis and the one or more second vortex chucks.

2. The method of claim 1 wherein the operation of rotating occurs simultaneously with emitting the first and second flows and simultaneously with the article being processed with plasma.

3. A method for holding an article, the method comprising:

emitting gas from a first vortex chamber to hold an article; and emitting gas from a second vortex chamber to hold the article;

wherein the gas emitted from the first vortex chamber is colder than the gas emitted from the second vortex chamber, the method further comprising rotating the article around at least one axis while emitting gas from the first and second vortex chambers, wherein a minimum distance between said axis and the first vortex chamber is smaller than a minimum distance between said axis and the second vortex chamber.

* * * * *